US008816357B2

(12) United States Patent
Utsugi et al.

(10) Patent No.: US 8,816,357 B2

(45) Date of Patent: Aug. 26, 2014

(54) OPTICAL PRINTER HEAD AND IMAGE FORMING APPARATUS

(75) Inventors: Kazuya Utsugi, Chiba (JP); Toshikazu Suzuki, Chiba (JP)

(73) Assignee: Seiko I Infotech Inc. (JP)

( * ) Notice: Subject to any disclaimer, the term of this patent is extended or adjusted under 35 U.S.C. 154(b) by 1376 days.

(21) Appl. No.: 11/362,652

(22) Filed: Feb. 27, 2006

(65) Prior Publication Data

US 2006/0192835 A1 Aug. 31, 2006

(30) Foreign Application Priority Data

Feb. 28, 2005 (JP) ................................ 2005-052191

(51) Int. Cl.
*H01L 27/15* (2006.01)

(52) U.S. Cl.
USPC ............... 257/79; 257/82; 257/257; 257/344; 257/E25.019; 257/13

(58) Field of Classification Search
USPC ................. 257/79, 82, 257, 344, 13, E25.019
See application file for complete search history.

(56) References Cited

U.S. PATENT DOCUMENTS 4,829,321 A * 5/1989 Iizuka et al. .................. 347/237
5,321,429 A * 6/1994 Ono et al. ..................... 347/238
5,475,417 A * 12/1995 Ogata et al. ................... 347/244
5,583,191 A 12/1996 Kawai et al.
6,913,715 B2 * 7/2005 Li et al. ........................ 264/1.36
7,187,501 B2 * 3/2007 Wakisaka ...................... 359/622
2004/0086724 A1 * 5/2004 Suzuki et al. ................. 428/446
2004/0196355 A1 10/2004 Takagi et al.

FOREIGN PATENT DOCUMENTS

| | | | |
|---|---|---|---|
| EP | 0 348 003 | A | 12/1989 |
| JP | 3 70940 | | 7/1991 |
| JP | 5150591 | | 6/1993 |
| JP | 06 043307 | A | 2/1994 |
| JP | 2001 171171 | A | 6/2001 |
| WO | WO 03/078171 | A | 9/2003 |

* cited by examiner

*Primary Examiner* — Elias M Ullah

(74) *Attorney, Agent, or Firm* — Adams & Wilks

(57) ABSTRACT

An optical printer head has an array of lenses that project light emitted by an array of LEDs onto a charged photosensitive drum to form a latent image on the drum surface. A resin film adhered to the exposed surfaces of the lenses prevents chemical reaction between nitric acid, formed as a consequence of ozone produced during electric charging of the photosensitive drum, and alkali components on the surfaces of the lenses thereby preventing clouding of the lens surfaces and dimming of the projected light. The resin film has a thickness of 10 to 100 microns and may be formed of polyvinyl chloride, polyethylene terephthalate or polymethyl meta acrylate.

8 Claims, 3 Drawing Sheets

OPTICAL PRINTER HEAD AND IMAGE FORMING APPARATUS

BACKGROUND OF THE INVENTION

1. Field of the Invention

The present invention relates to an optical printer head and an image forming apparatus.

2. Related Background Art

Conventionally, an optical printer head, such as an LED array head, is employed as exposure means for an image forming apparatus, such as an electrophotographic printer.

FIG. 4 is a schematic diagram showing the configuration of an electrophotographic printer.

In FIG. 4, the electrophotographic printer includes a photosensitive drum 101, a charging device 102, an LED array head 103, a developing device 104, a transfer device 105, a charge elimination device 106, a cleaning device 107 and a sheet feeding device 108.

When the photosensitive drum 101 is exposed to light after a charge has been placed on the surface of the photosensitive drum 101, a latent image, consonant with the light, is formed on the surface. In this case, the photosensitive drum 101 is rotated in a direction indicated by an arrow A.

The charging device 102, through the discharge of electrons, places a negative charge having a predetermined potential on the surface of the photosensitive drum 101.

The LED array head 103 includes a plurality of LEDs, linearly arranged, and a lens for controlling light emitted by the LEDs. Individual LEDs in the LED array head 103 emit light selectively, based on externally received image data, to irradiate the surface of the photosensitive drum 101, which carries a charge having a predetermined potential, and to form a latent image thereon.

The developing device 104 then develops the latent image formed on the photosensitive drum 101 by generating a toner image (a picture image), and the transfer device 105 transfers the toner image from the photosensitive drum 101 to a recording sheet 109 fed by the sheet feeding device 108.

Thereafter, the charge elimination device 106 removes the charge from the surface of the photosensitive drum 101, and the cleaning device 107 cleans the surface of the photosensitive drum 101.

In an image forming apparatus employing an optical printer head, oxygen molecules in the air are ionized by the discharge of the charging device 102 and ozone is generated.

Ozone reacts with nitrogen in the air to produce a nitrogen compound and this nitrogen compound combines with water in the air and becomes nitric acid. Nitric acid chemically reacts with an alkali component on the surface of the lens of the optical printer head and becomes potassium nitrate, which is attached to the surface of the lens and causes the lens of the optical printer head to be clouded over.

When the lens of the optical printer head is clouded over; the light emitted by the optical printer head is partially blocked, and is dimmer. Accordingly, since the intensity of the light projected onto the photosensitive drum is thereby reduced, a blurred image is produced.

In patent document 1 (Japanese Patent Laid-Open Publication No. 2001-171171), an image forming apparatus is described that can prevent the dimming of light at the lens of an optical printer head.

The image forming apparatus in patent document 1 includes an LED array head having a lens that is covered with a photo catalyst layer. The photo catalyst layer is activated when irradiated with light, and induces the decomposition of an organic material that is attached to the outer surface of the lens.

When, however, a photo-catalyst layer is employed to prevent the dimming of light at the lens, an optical printer head, and an image forming apparatus that employs this optical printer head, becomes expensive.

SUMMARY OF THE INVENTION

One objective of the invention is to provide, at a low cost, an optical printer head that can prevent the dimming of light at a lens, and an image forming apparatus that employs such an optical printer head.

To achieve this objective, according to one aspect of the invention, an optical printer head comprises:

a light-emitting device;

a lens, for controlling light emitted by the light-emitting device; and a resin layer, for covering the lens.

According to this aspect, the resin layer that covers the lens prevents the occurrence of a chemical reaction between nitric acid, generated in association with the production of ozone, and an alkali component on the surface of the lens. Thus, the dimming of light at the lens can be prevented.

Therefore, an optical printer head can be provided, at a low cost, that can prevent the dimming of light at the lens, without an expensive material, such as a photo-catalyst layer, being required.

According to another aspect of the invention, an image forming apparatus comprises:

a photosensitive member;

a charging device, for applying a charge having a predetermined potential to a surface of a photosensitive member;

an optical printer head, for exposing to light, to generate a latent image, the surface of the photosensitive member to which the charge having the predetermined potential is applied;

a developing device, for developing the latent image and generating an image; and a transfer device, for transferring the image to a recording medium, wherein the optical printer head includes a light-emitting device, a lens for controlling light emitted by the light-emitting device, and a resin layer for covering the lens.

According to this aspect, since an optical printer head having a low cost can be employed, an image forming apparatus having a low cost can be provided that can prevent a reduction in image quality.

According to the invention, the resin layer that covers the lens prevents a chemical reaction between nitric acid, generated in association with the occurrence of ozone, and an alkali component on the surface of the lens. Thus, the dimming of light at the lens can be prevented.

Therefore, an optical printer head can be provided, at a low cost, that can prevent the dimming of light at a lens without an expensive material, such as a photo-catalyst layer, having to be employed, and an image forming apparatus can be provided that employs such an optical printer head.

DETAILED DESCRIPTION OF THE PREFERRED EMBODIMENT

An image forming apparatus according to one embodiment of the present invention will now be described while referring to the accompanying drawings.

Figure 1:
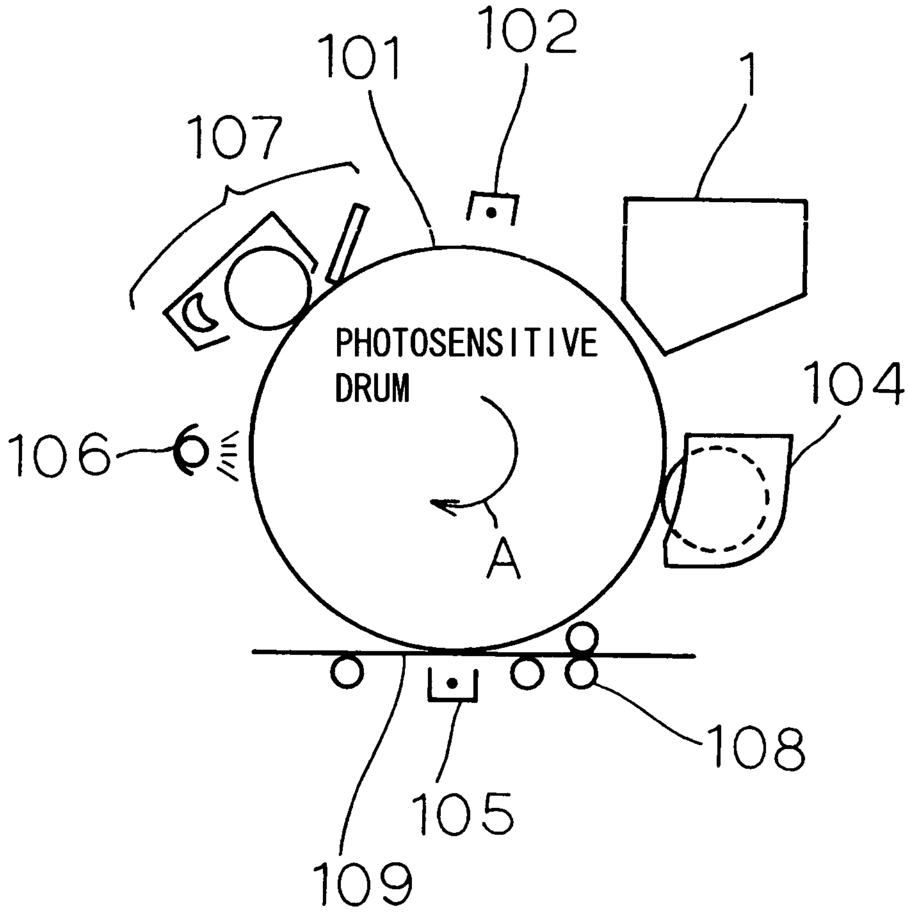
FIG. 1 is a schematic diagram showing the configuration of an image forming apparatus according to one embodiment of the present invention.
Figure 4:
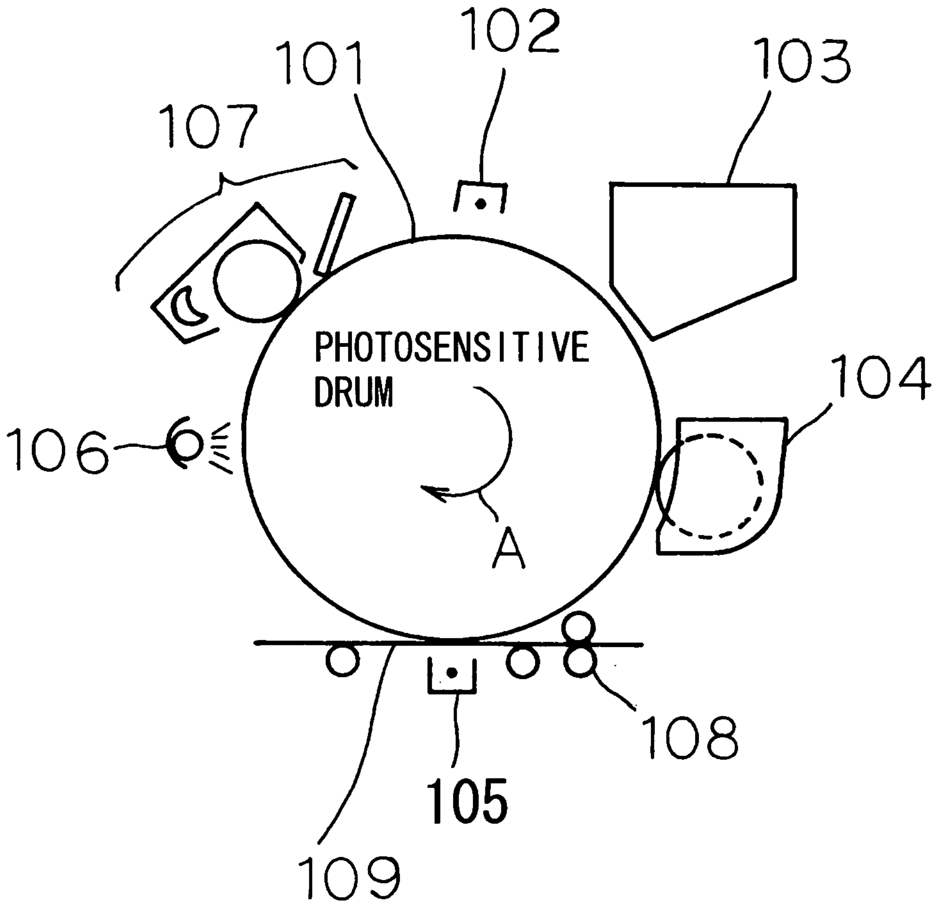
FIG. 4 PRIOR ART
FIG. 4 is a schematic diagram showing the configuration of a conventional image forming apparatus.

FIG. 1 is a schematic diagram showing the configuration of an electrophotographic printer according to the embodiment. In FIG. 1, the same reference numerals as used in FIG. 4 are employed to denote corresponding components.

In FIG. 1, the electrophotographic printer includes an LED array head 1, a photosensitive drum 101, a charging device 102, a developing device 104, a transfer device 105, a charge elimination device 106, a cleaning device 107 and a sheet feeding device 108.

The electrophotographic printer is an example of an image forming apparatus, the LED array head 1 is an example of an optical printer head, and the photosensitive drum 101 is an example of a photosensitive member.

The LED array head 1 emits light to irradiate the surface of the photosensitive drum 101 to which a charge, having a predetermined potential, has been applied for the generation of a latent image.

Figure 2:
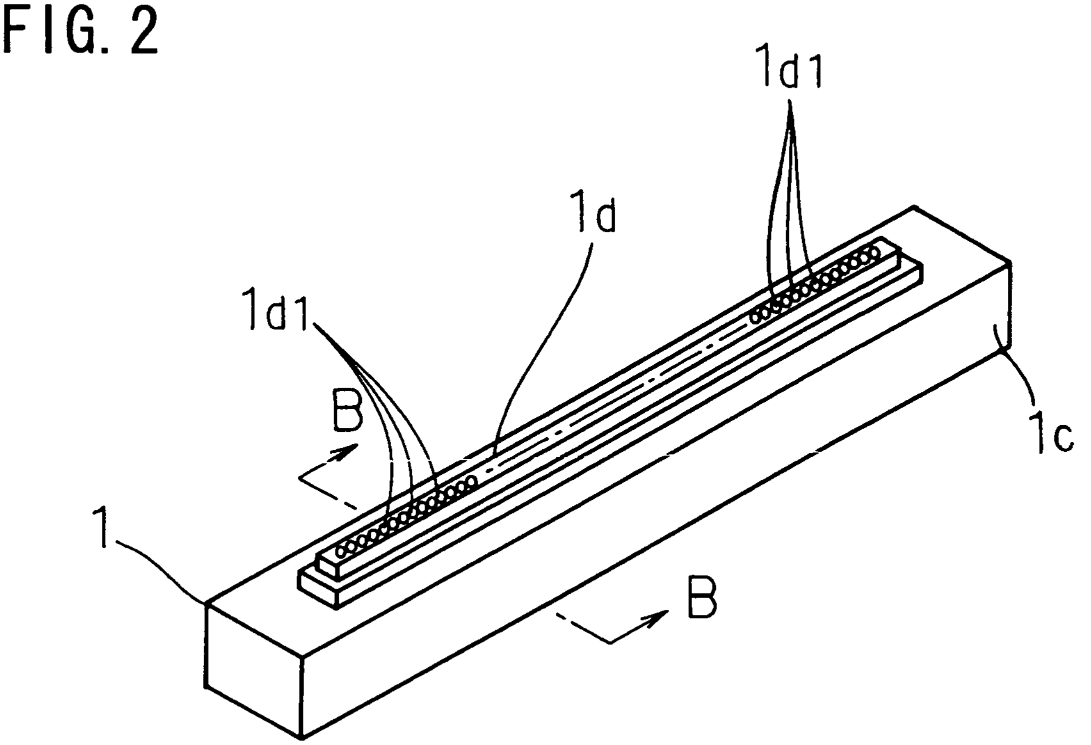
FIG. 2 is a perspective view of the external appearance of an optical printer head according to one embodiment of the present invention.

FIG. 2 is a perspective view of the LED array head 1.

Figure 3:
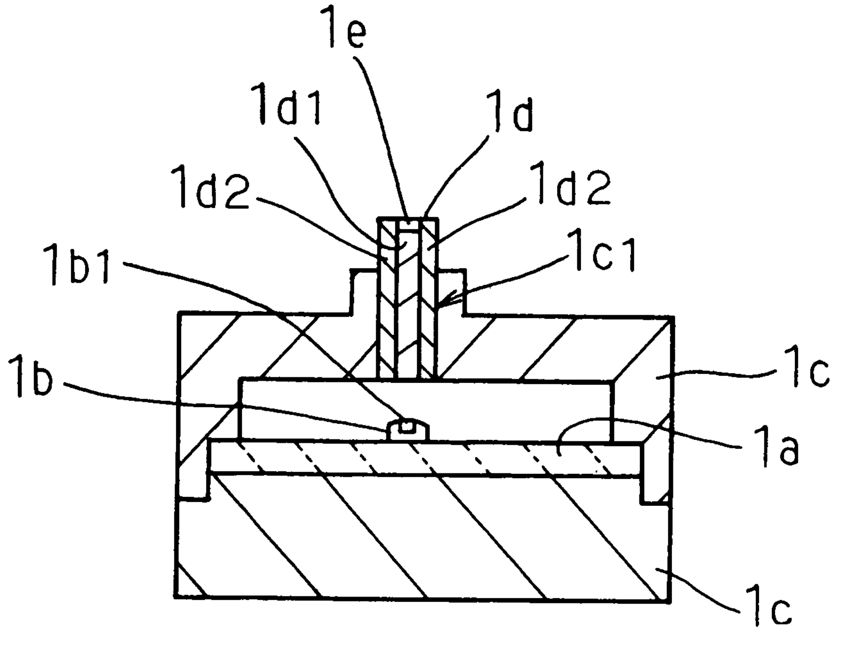
FIG. 3 is a cross-sectional view taken along line B-B in FIG. 2.

FIG. 3 is a cross-sectional view, taken along line B-B in FIG. 2, of the LED array head 1.

In FIGS. 2 and 3, the LED array head 1 includes a substrate 1*a*, an LED array 1*b*, a housing 1*c*, a rod lens array 1*d* and a resin layer 1*e*. The LED array 1*b* comprises a plurality of linearly arranged LEDs (light-emitting elements or devices) 1*b*1, and the housing 1*c* has an opening 1*c*1 formed in a front side thereof, and the rod lens array 1*d* has a lens 1*d*1 and a frame having opposed frame members 1*d*2, 1*d*2 mounted in the opening 1*c*1. As illustrated, the resin layer 1*e* is adhered to the surface of the rod lens array 1*d* at a location between the opposed frame members 1*d*2, 1*d*2.

The LED array 1*b* is disposed on the substrate 1*a*.

When image data are received from a drive circuit (not shown), the LEDs 1*b*1 of the LED array 1*b* emit light in accordance with the received image data.

The substrate la is accommodated in the housing 1*c*, and the opening 1*c*1 is formed immediately above the LED array 1*b* on the substrate 1*a*.

The rod lens array 1*d* is arranged in the opening 1*c*1 of the housing 1*c*, and includes the plurality of linearly arranged lenses 1*d*1 and the frame members 1*d*2, 1*d*2.

The rod lens array 1*d* (specifically, the lenses 1*d*1) controls the light emitted by the LEDs 1*d*1, so that the emitted light is projected or directed onto the photosensitive drum 101.

Each lens 1*d*1 is coated with the resin layer (e.g., a transparent resin film) 1*e* that prevents a chemical reaction between nitric acid, generated as a consequence of the occurrence of ozone, and an alkali component on the surface of the lens 1*d*1. Thus, the dimming of light at the lens 1*d*1 can be prevented.

Either polyvinyl chloride (PVC), which is highly transparent and extremely resistant to acid and alkali and is a low crystalline, polyethylene terephthalate (PET) that is highly transparent and has both superior mechanical strength and a superior electric characteristic, or polymethyl meta acrylate (acryl), which possesses both a superior optical characteristic and weather resistance and is highly transparent, is especially appropriate for the resin layer. One of these resins is processed to form a film, and is closely adhered to the lens face, covering the lens, so as to provide the resin layer of this embodiment. Since light transmission would be degraded were the resin layer too thick, it is preferable that a thickness of about 10 to 100 microns be used.

The operation performed for this embodiment will now be described.

While the photosensitive drum 101 is being rotated in the direction indicated by an arrow A, the charging device 102, through the discharge of electrons, applies a negative charge having a predetermined potential to the surface of the photosensitive drum 101.

As a result of the discharge of the charging device 102, oxygen molecules in the air are ionized, and ozone is generated. Ozone then reacts with nitrogen in the air, becoming a nitrogen compound, and the nitrogen compound combines with water in the air and becomes nitric acid.

Were the resin layer 1*e* not present, this nitric acid would react with an alkali component on the surface of the lens 1*d*1, becoming potassium nitrate, and would be attached to the surface of the lens 1*d*1.

However, in this embodiment, since the resin layer 1*e* has been applied to coat the lens 1*d*1, the resin layer 1*e* prevents a chemical reaction between the nitric acid and the alkali component on the surface of the lens 1*d*1. Thus, the dimming of light at the lens 1*d*1 can be prevented.

When image data are transmitted by a drive circuit (not shown), the LEDs 1*b*1 of the LED array head 1 emit light in consonance with the image data to generate a latent image on the surface of the photosensitive drum 101.

At this time, since the resin layer 1*e* prevents the dimming of light at the surface of the lens 1*d*1, a reduction in the intensity of the light emitted by the LED 1*b*1, due to the dimming of light at the lens 1*b*1, can be prevented. Therefore, the possibility that the quality of a latent image formed on the photosensitive drum 101 will be degraded is reduced.

Thereafter, the developing device 104 develops the latent image on the photosensitive drum 101 to obtain a toner image (a picture image). Then, the transfer device 105 transfers the toner image from the photosensitive drum 101 to the recording sheet (a recording medium) 109 that is conveyed by the sheet feeding device 108. Following this, the charge elimination device 106 removes the charge applied to the surface of the photosensitive drum 101 and the cleaning device 107 cleans the surface of the photosensitive drum 101.

According to this embodiment, the resin layer 1*e*, with which the lens 1*d*1 is coated, prevents a chemical reaction between nitric acid, generated in consonance with the occurrence of ozone, and the alkali component on the surface of the lens 1*d*1. Thus, the dimming of light at the lens 1*d*1 can be prevented.

Therefore, an LED array head can be provided, at a low cost, that can prevent the dimming of light at the lens, without the use of an expensive material, such as a photo-catalyst layer, being required.

Furthermore, the electrophotographic printer employs the LED array head 1. Thus, an electrophotographic printer can be provided, at a low cost, with which the degrading of the image quality can be prevented.

The illustrated configuration for the above described embodiment is merely an example, and the present invention is not limited to this configuration.

For example, in this embodiment, the LED array head 1 is employed as an optical printer head; however, the optical printer head is not limited to the LED array head 1, and can be appropriately changed. Further, in this embodiment, an LED is employed as a light-emitting device; however, the light emitting device is not limited to an LED, and can be appropriately changed.

In addition, in this embodiment, a recording sheet is employed as a recording medium; however, the recording medium is not limited to a recording sheet, and can be arbitrarily changed.

Moreover, the electrophotographic printer of this embodiment can be employed as various types of image output apparatuses.

For example, when image data to be supplied to the LED array head 1 are image data consonant with an image read by a scanner, the electrophotographic printer in this embodiment can be used as a copier.

And when image data to be supplied to the LED array head 1 are image data transmitted by an external information processing apparatus, the electrophotographic printer of this embodiment can be used as a normal printer.

What is claimed is:

1. An optical printer head comprising:

a light-emitting device that emits light;

a rod lens array that controls light emitted by the light-emitting device;

a frame having opposed frame members that extend along the entire length of the rod lens array and that support therebetween the rod lens array;

a housing in which the light-emitting device is disposed and which supports the frame and the rod lens array above the light-emitting device so that light emitted by the light-emitting device is irradiated on a photosensitive drum during use of the optical printer head; and a resin film that is 10 to 100 microns thick and that is closely adhered to the surface of an end of the lens array and disposed between the opposed frame members.

2. An optical printer head according to claim 1; wherein the resin film is a polyvinyl chloride film, a polyethylene terephthalate film or a polymethyl meta acrylate film.

3. An optical printer head according to claim 1; wherein the surface of the lens has thereon an alkali component.

4. An image forming apparatus comprising:

a photosensitive drum;

a charging device that applies a charge having a predetermined potential to a surface of the photosensitive drum;

an optical printer head that irradiates the charged surface of the photosensitive drum with light to form a latent image;

a developing device that develops the latent image to form an image; and a transfer device that transfers the image to a recording medium, wherein the optical printer head includes a light-emitting device that emits light, a rod lens array that controls light emitted by the light-emitting device, a frame having opposed frame members that extend along the entire length of the rod lens array and that support therebetween the rod lens array, a housing in which the light-emitting device is disposed and which supports the frame and the rod lens array above the light-emitting device so that light emitted by the light-emitting device is irradiated on the photosensitive drum, and a resin film that is 10 to 100 microns thick and that is closely adhered to the surface of the rod lens array and disposed between the opposed frame members.

5. An optical printer head comprising: an enclosed housing having a front side; light-emitting elements disposed in a linear array inside the housing and that emit light directed towards the front side of the housing; a rod lens array having a plurality of rod lenses that are disposed in a linear array in an opening in the front side of the housing and that direct light emitted by the light-emitting elements in a given direction outwardly of the housing; a frame mounted in the opening and supported by the front side of the housing, the frame having opposed frame members that extend along the entire length of the rod lens array and that support therebetween the rod lenses so that they direct light emitted by the light-emitting elements in the given direction; and a resin film having a thickness in the range 10 to 100 microns and adhered to end surfaces of the rod lenses at a location between the opposed frame members to prevent chemical reaction between nitric acid and other components on the end surfaces of the rod lenses.

6. An optical printer head according to claim 5; wherein the resin film is a polyvinyl chloride film, a polyethylene terephthalate film or a polymethyl meta acrylate film.

7. An optical printer head according to claim 6; wherein the resin film is effective to prevent chemical reaction between nitric acid and an alkali component on the surfaces of the lenses.

8. An optical printer head according to claim 5; wherein the resin film is effective to prevent chemical reaction between nitric acid and an alkali component on the surfaces of the lenses.

* * * * *